United States Patent [19]

Lyman

[11] 4,303,836
[45] Dec. 1, 1981

[54] AUDIO SILENCER FOR RADIO AND T-V SETS

[76] Inventor: Daniel Lyman, R.D. 2, Box 119, Wells Bridge, N.Y. 13859

[21] Appl. No.: 125,524

[22] Filed: Feb. 28, 1980

[51] Int. Cl.³ .......................... H01H 3/02; H02J 13/00
[52] U.S. Cl. .................................. 307/114; 307/142; 307/143; 307/144; 307/154; 358/194.1; 361/160; 335/126
[58] Field of Search ............... 307/114, 112, 139, 142, 307/143, 144, 154; 339/74 R, 42, 183; 335/126, 2; 361/160; 179/1 PC, 1 SW; 358/194, 198, 188, 185

[56] References Cited

U.S. PATENT DOCUMENTS

| | | | |
|---|---|---|---|
| 3,424,865 | 1/1969 | Marchand | 358/165 X |
| 4,032,206 | 6/1977 | Lerner | 339/42 |
| 4,229,765 | 10/1980 | Sanger | 358/188 |

Primary Examiner—L. T. Hix
Assistant Examiner—Stafford D. Schreyer
Attorney, Agent, or Firm—Michael Ebert

[57] ABSTRACT

A silencer adapted to suppress the audio output of a radio or television set during commercial breaks in a program. The silencer which requires no wiring changes in the set includes a probe insertable in the existing earphone jack. The probe is constituted by a truncated tubular plug whose length falls short of the flexible switch arm of the jack that normally engages a contact arm to connect the audio signal line to the loudspeaker, the plug having a retractable plunger therein. When the plug is advanced by a local actuator, it engages the switch arm of the jack to flex it away from the contact arm to cut off loudspeaker sound, the sound being restored when the plunger is retracted. The local actuator of the plug is coupled to a remote actuator which when manually-activated acts selectively through the local actuator to advance or retract the plunger to cut off sound at the outset of a commercial break and to restore it at the conclusion thereof.

8 Claims, 4 Drawing Figures

U.S. Patent     Dec. 1, 1981     4,303,836
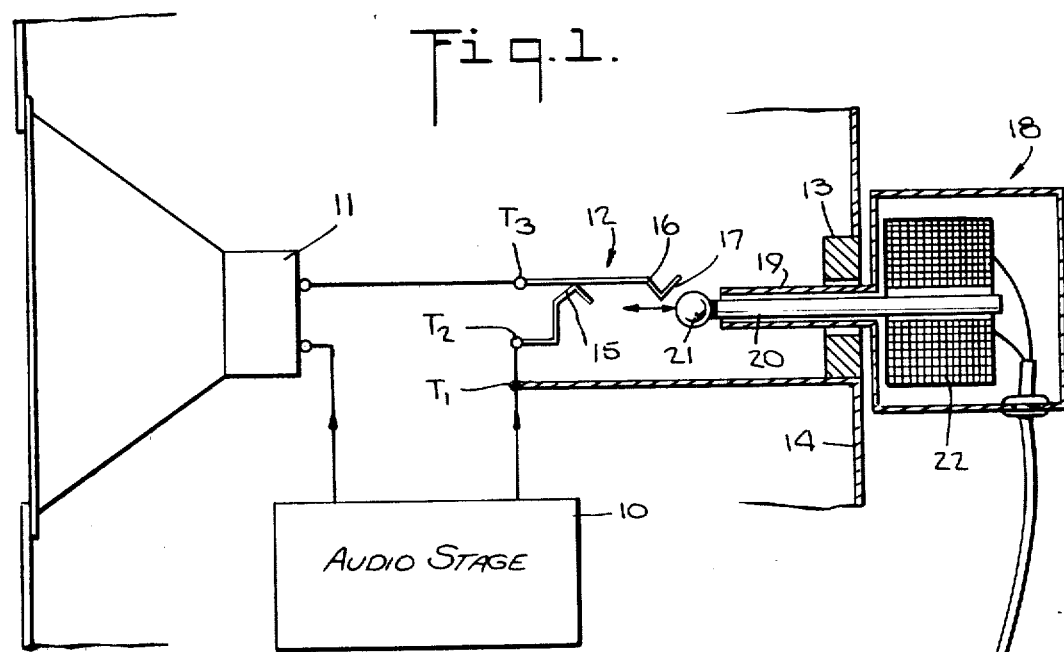
Fig.1.
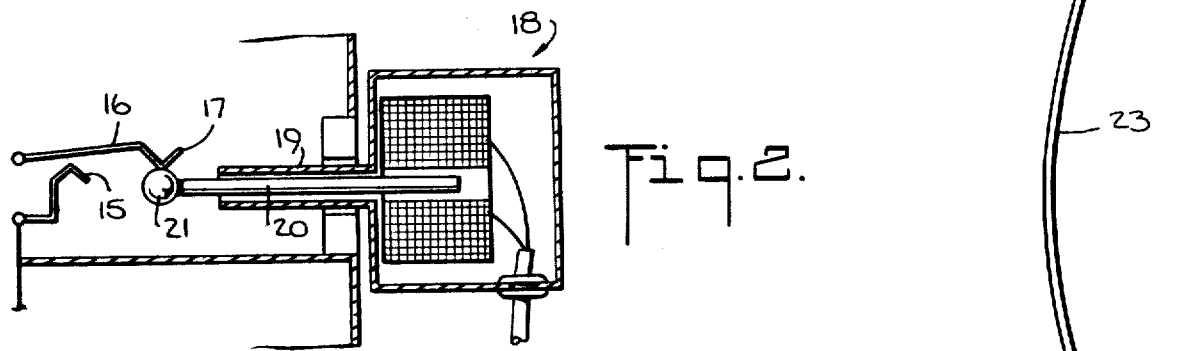
Fig.2.
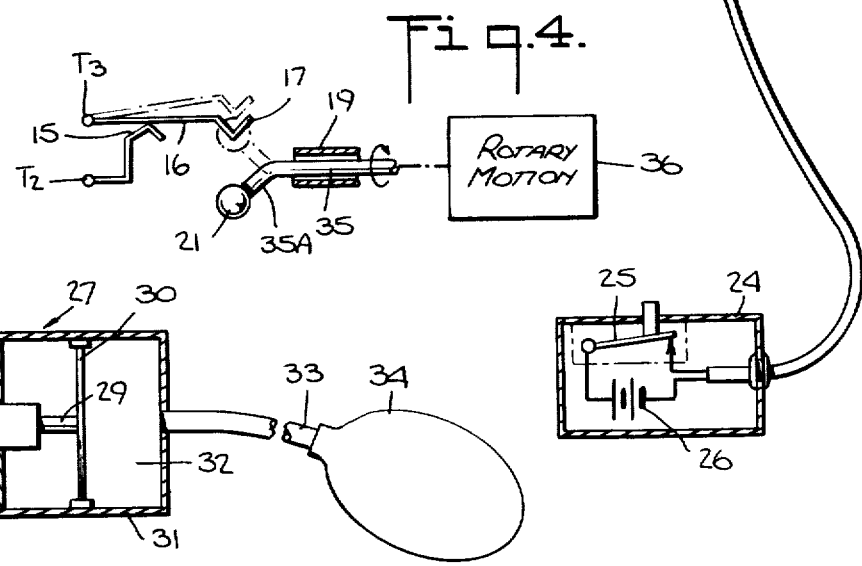
Fig.4.
Fig.3.

AUDIO SILENCER FOR RADIO AND T-V SETS

BACKGROUND OF INVENTION

This invention relates generally to a silencer manually operable from a remote post and adapted to suppress the audio output of a radio or television set during commercial breaks, and more particularly to a silencer which entails no wiring changes in the set and whose installation only requires the insertion of a probe in the existing earphone jack.

The typical radio or television program in the United States, regardless of whether it has an entertainment, sports or informational format, is plagued by commercial breaks. In present day broadcasting, commercial breaks or advertising messages usually have a one or two minute duration, though in some instances they last only twenty seconds.

Except for public service stations, radio and television broadcasting in the United States is a profit-making enterprise. The tendency therefore on the part of station operators is to interpose as many commercial breaks as a viewer or listener can be expected to tolerate before being driven by excessive advertising to switch to another channel. Where programming standards are high, the commercial breaks are scheduled for points of minimal interference. Thus it is not considered good practice to interrupt the performance of a symphony, nor to wedge in a commercial break at the height of a dramatic episode in a televised movie.

But the commercial interest of sponsors are not usually compatible with good broadcasting practice. Thus in order to draw attention to an advertising message, the commercial may be deliberately pitched at a higher sound level than that of the program interrupted thereby. A common advertising technique in television commercial breaks in which a sound track is used to accompany a visual presentation of a product is to create sound effects which are deliberately irritating or stimulating in order to heighten interest. For example, the attention-getting reflex effect of a telephone ring is often incorporated in radio and T-V commercials.

A listener or viewer who is disquieted by commercial breaks is, of course, not compelled to listen and is free to turn down the sound until the break is over. But this is more easily said than done, for the set is not usually within ready reach. Thus a T-V viewer normally is at least 10 feet from the screen and cannot be expected, each time there is a commercial, to rise from his seat to control the sound. Indeed with some progams, a viewer disturbed by commercials would spend his time rushing repeatedly to and from his viewing post if he wished not to hear these breaks.

Those set owners who possess remote-control or so-called space-command units have an obvious advantage, for they are able from their viewing or listening post to cut off sound during commercial breaks. But very few sets on the market include a remote control capability, for sets of this type are more costly than conventional receivers.

It is a relatively simple matter to provide a manually-operated silencer switch external to the set that is connected by an extension wire to the audio signal line leading to the loudspeaker. But to make this installation, one has to invade the set, locate and cut the audio signal line and then wire-in the extension line.

There are practical drawbacks to an installation of this type. In the case of a T-V set which includes high-voltage supply, even a simple wiring modification which entails opening up the set can be hazardous if not carefully done by a serviceman. Moreover, the extension line from the set then carries the audio signal to the remote switch. While the audio current intensity is not high, this too represents a possible hazard, for an internal fault in the set may cause a high voltage to be applied to audio signal line. Also an unauthorized invasion of a television set will ordinarily terminate its manufacturer's warranty.

Another and more sensible approach to the problem is that disclosed by the Lerner U.S. Pat. No. 4,032,206 whose purpose is not to cut off but to control the volume of T-V sound from a remote station. To this end, Lerner inserts a standard plug in the existing earphone jack of the T-V set, the jack being connected by an extension line to a remote volume control resistor which is then in series with the loudspeaker of the set and acts as a volume control therefor.

There are two practical drawbacks to the Lerner arrangement. First, if the objective is not to control the volume of broadcast sound but to cut it off entirely so as to suppress commercial breaks, then each time there is a break, the operator of the Lerner device must turn the remote control all the way in one direction to the point of maximum resistance. After the commercial break is over the operator must then turn the remote control in the reverse direction until the sound is again at the desired level.

Not only is the Lerner arrangement incapable of providing a simple sound-on or sound-off action, but it requires a readjustment of the sound level each time sound is restored. In television viewing, the set operator, after selecting a channel for viewing, will normally adjust the volume of the set to a sound level which suits his taste. Once this sound level is set, the operator has no further need to change it until such time as he changes the channel setting.

But with Lerner, the sound level has to be reset after each commercial break, for the setting is upset whenever the operator turns down the volume. Moreover, the extension line in the Lerner installation carries the audio signal current into the viewing area, which, as previously explained, is undesirable.

SUMMARY OF INVENTION

In view of the foregoing, the main object of this invention is to provide a silencer manually-operable from a remote post and adapted to suppress the audio output of a phonograph radio or television set during commercial breaks or other intervals, which silencer requires no wiring changes in the set to install.

More particularly, an object of this invention is to provide a silencer of the above-type which acts to interrupt the flow of audio signal current to the loudspeaker of the set without conducting this signal to a post external to the set whereby the installation of the silencer in no way interferes with the electrical integrity of the set or introduces a possible electrical hazard.

Also an object of the invention is to provide a silencer which acts to cut off the audio of the set and whicn, when de-activated, immediately restores the audio to the volume level that existed before cut off.

A significant feature of the invention is that the silencer operates efficiency and reliably, and may be mass-produced at low cost. Thus all existing owners of radio and television receivers who purchase an inexpensive silencer are thereafter able, at will, to suppress objectionable commercials and other disturbing sound intervals which militate against program enjoyment.

Briefly stated, these objects are attained in a silencer in accordance with the invention which includes a probe that is insertable in the standard earphone jack of the set, the jack having a flexible switch arm therein which normally engages a contact arm to connect the audio signal line to the set loudspeaker, so that when a conventional earphone plug is inserted, the audio signal is then directed from the loudspeaker to the earphone.

The probe is constituted by a truncated tubular plug having a retractable plunger therein, the length of the plug falling short of the flexible switch arm so that upon insertion in the jack, the plug functions only to physically hold the probe therein. When, however, the plunger within the plug is advanced, its head engages the switch arm of the jack to flex it away from the contact arm and thereby cut off loudspeaker sound, the sound being restored when the plunger is retracted. In another embodiment, the head may be eccentrically mounted at the end of a rotatable member to provide a similar action.

The probe further includes a local actuator for operating the plunger, which local actuator is coupled by an extension cable to a remote actuator. When manually operated, the remote actuator acts through the cable to activate the local actuator and thereby advance or retract the plunger to cut off the sound at the outset of a commercial break and to restore it at the conclusion thereof.

The local actuator may take the form of a pneumatic, hydraulic, electromechanical or any other device capable of controlling the axial position of the plunger, the remote actuator having a related form. Thus if use is made of an electromagnetic latching solenoid to operate the plunger, the remote actuator in that instance may simply be a battery supply and a switch to apply pulses through the cable for energizing the solenoid.

OUTLINE OF THE DRAWINGS

For a better understanding of the invention as well as other objects and further features thereof, reference is made to the following detailed description to be read in conjunction with the accompanying drawings wherein:

FIG. 1 schematically illustrates one preferred embodiment of a silencer in accordance with the invention, the silencer including a probe having a retractable plunger;

FIG. 2 shows the retractable plunger at an axial position at which it acts to cut off the sound of the set;

FIG. 3 illustrates a second embodiment of the invention; and

FIG. 4 shows a third embodiment of the invention.

DESCRIPTION OF THE INVENTION

First Embodiment:

Referring now to FIGS. 1 and 2 there is shown a first embodiment of a silencer for use in conjunction with a radio or television receiver having audio stages 10 whose audio signal output is applied to a loudspeaker 11 through a standard earphone jack, generally designated by numeral 12.

Jack 12 is formed by a metal ring 13 secured to the rear face of a panel to define an inlet port for receiving a standard earphone jack, metal ring 13 being connected to a first terminal $T_1$. The jack further includes a contact arm 15 connected to a terminal $T_2$ and a flexible switch arm 16 connected to a terminal $T_3$. Switch arm 16 normally engages contact arm 15 and is provided at its free end with a nose 17 that is bent downwardly with respect to the plane of the swtich arm.

The electrical arrangement is such that the audio signal output from audio stages 10 is fed by an audio line through the normally-closed switch defined by switch arm 16 and contact arm 15 to loudspeaker 11. When, however, switch arm 16 is deflected upwardly, the switch is opened and loudspeaker sound is cut off. In conventional use, when an earphone plug is inserted in the jack, the audio line is then connected to the earphone, but in the present invention, no use is made of the audio signal when the audio line to the loudspeaker is disconnected, the audio being suppressed.

In a silencer in accordance with the invention, the jack switch is operated by means of a probe, generally designated by numeral 18, which is insertable in receiver jack 12 through the port defined by ring 13. Probe 18 includes a truncated tubular plug 19 whose diameter is the same as the conventional earphone plug for which the jack is intended but whose length is somewhat shorter. When fully inserted, truncated plug 19 still falls short of nose 17 of switch arm 16.

Received within plug 19 is a retractable plunger 20 of ferromagnetic material provided at its forward end with an insulating head 21. When the plunger is axially advanced, head 21 acts as shown in FIG. 2, to engage nose 17 and thereby flex switch arm 16 away from contact arm 15. This action breaks the audio circuit to the loudspeaker and cuts off the sound. In practice, head 21 need not be of an insulating material such as nylon, but may be a metal ball insulated from plunger 20.

Selective axial movement of plunger 20 is effected by a local actuator secured to the outer end of plug 19. In the embodiment shown, the local actuator takes the form of a latching-type solenoid 22 whose ferromagnetic core is constituted by the rear portion of plunger 20. The latching-type solenoid is designed so that when a first current pulse is applied thereto, plunger 20 is caused by the resultant magnetic field to advance axially and thereby break the jack switch, the advanced axial positions being latched. This latch is released when a second pulse is applied to the solenoid, causing axial retraction of the plunger by means of a bias spring (not shown) thereby reclosing the audio signal switch and restoring loudspeaker sound.

The local actuator may be in any other known electromagnetic or relay form capable of advancing the plunger when a first pulse is applied thereto in a given polarity and of retracting the plunger when a second pulse is applied thereto in the same or reverse polarity, depending on the nature of the device.

In order to operate the local actuator from a remote post, the silencer includes an extension cable 23 which electrically links the local actuator solenoid to a remote control box or actuator 24. In the embodiment shown this includes a push button switch 25 in series with a power cell 26, such that when switch 25 is momentarily closed, a current pulse is generated which is transmitted by the cable to the local actuator.

To facilitate operation of the silencer, switch 25 is preferably of the Micro-Switch type which only requires a momentary touch to activate. Thus the user of the silencer has only to lightly tap the switch button when he wishes to cut off sound at the outset of a commercial break and to again tap the switch when he wishes to restore the sound to its pre-set level.

Alternatively, instead of coupling the local actuator to the remote actuator by means of a cable, a wireless link may be used. In that case, the remote station must be designed, upon operation of its switch, to transmit an ultra-high frequency radio signal burst having a predetermined frequency which is intercepted at the local actuator and then demodulated to produce a control signal for triggering a solid-state switch arranged to apply local battery power to the latching solenoid. The operation of the silencer in all other respects is the same as that described in connection with FIG. 1.

Second Embodiment:

As shown in FIG. 3, in this instance the probe of the silencer is generally designated by numeral 27 and makes use of a click-type push button mechanism 28 operatively coupled to plunger 20 and provided with an operating pin 29 secured to a diaphragm 30.

The click-type mechanism is of the well known type commonly used with retractable ball point pens. The mechanism is such that when pin 29 is first pressed in, it acts to extend the pen axially from a barrel or cylinder; and when the pin is again pressed in, it acts to cause retraction of the pen. In this embodiment, instead of a pin, mechanism 28 functions to advance or retract plunger 20 coupled thereto. The click mechanism for this purpose may also be of the common push on/push off electrical switch type.

Diaphragm 29 defines within a housing 31 a forward chamber which contains the click-type mechanism 28 and a rear pneumatic chamber 32. Chamber 32 is coupled by a hollow flexible cable 33 to a remote actuator in the form of a squeeze bulb 34. Thus when bulb 34 is squeezed, the resultant pneumatic pressure imposed is transmitted by the cable to pneumatic chamber 32 and imposed on diaphragm 30 which is deflected and thereby actuates the click mechanism to advance or retract the plunger and cut off or restore audio sound. That is to say, a first squeeze by the user causes the sound to cut off and a second squeeze restores the sound.

In practice instead of air, use may be made of a suitable incompressible hydraulic fluid for a more positive action. Thus a slight pressure applied to the squeeze bulb will cause the hydraulic fluid in chamber 31 to deflect diaphragm 30. Alternatively, use may be made of a cable extension of the type used to operate camera shutters.

Third Embodiment and Further Modifications:

In the first and second embodiments, the probe inserted in the jack includes a retractable plunger which is axially extendable so that when the plunger is advanced, its head then engages the nose at the end of the switch arm to flex the arm and thereby cut off the sound.

The same result can be achieved by a probe, as shown in FIG. 4, which includes a rotatable shaft 35 coaxially disposed within plug 19 and provided at its forward end by a bent portion 35A which terminates in head 21 whereby the head is eccentrically mounted on the shaft. Shaft 35 is operatively coupled to a rotary stepping motor 36 or similar local actuator whereby a first energizing pulse applied thereto causes the shaft to rotate to a degree shifting head 21 from a position, as indicated in solid lines, at which the head is displaced from nose 17 of switch arm 16, to a position, as shown by dashed lines, in which the head engages the nose to flex the arm and thereby disconnect it from contact arm 15 to cut off sound. The next pulse applied to the stepping motor causes the head to resume its initial position and restore sound.

Alternatively, instead of using an axially-displaceable plunger whose head, when the plunger is advanced, engages the nose of the switch arm to flex it away from the contact arm, the length of this plunger may be made such as to initially place the head behind the nose when the plunger is in its advanced or forwardly-extended state. Then when this long plunger is retracted, only then does the head engage the nose of the switch arm to cut off sound. This arrangement, therefore, is the very reverse of that disclosed in the first and second embodiments in terms of the relationship between the axial position of the plunger and the state of the sound.

While the invention has been shown and described as taking the form of a silencer for radio and TV sets, it will be appreciated that it is also useful as a silencer for stereo or other phonograph amplifiers provided with an earphone jack. Thus an individual who may be listening to phonograph records at a post well removed from his stereo equipment can, by means of the silencer in accordance with the invention, cut off the sound immediately without having to return to the set. This action may be desirable should the listener wish to answer a telephone ring or perform some other function which requires that the stereo sound be silenced.

In summary, therefore, the invention encompasses a probe insertable in a standard earphone jack in a radio, phonograph or TV set, which probe includes a head supported at the end of a control member disposed within a plug receivable in the jack, which head is caused by a local actuator operatively coupled to the member and controlled from a remote actuator to axially shift or otherwise change its position from a point displaced from the nose of the switch arm of the jack to a point in engagement therewith to cut off the sound of the set.

While there have been shown and described preferred embodiments of an audio silencer for radio and T-V sets in accordance with the invention, it will be appreciated that many changes and modifications may be made therein without, however, departing from the essential spirit thereof.

Thus instead of using a rotatable or axially-shiftable member to carry the head into engagement with the nose to flex the switch arm, use may be made of a screw-type member which is turned to bring the head into or out of engagement with the nose. Also, instead of a round head, use may be made of a conically-shaped head which is attached to the end of a plunger to provide a cam action to engage and lift the nose. This conical head may be secured to the plunger by a threaded coupling so that its position may be adjusted to a point where, when the plunger is advanced, the head engages the nose to only slightly flex the switch arm, thereby reducing the energy requirements for the probe.

I claim:

1. An audio silencer for use with a phonograph amplifier, radio or TV set having an earphone jack provided with a flexible switch arm that has an end nose and normally engages a contact arm to connect an audio signal line to the loudspeaker of the set to produce sound, said silencer comprising:

A. a probe including a hollow plug which when inserted in the jack falls short of said nose, said plug having disposed therein a control member terminating in a head which normally occupies a position displaced from the nose and which, when the member is operated, engages said nose to flex said switch arm away from said contact arm and thereby cut off the sound, and a local actuator operatively coupled to said member to operate same; and B. a remote actuator disposed at a listening post and manually operable to transmit control signals to said local actuator to selectively operate said member to cut off and restore the sound.

2. An audio silencer as set forth in claim 1, wherein said member is constituted by an axially-shiftable plunger which when advanced by said local actuator causes said head to engage said nose to cut off sound, and when retracted returns said head to its normal position to restore sound.

3. An audio silencer as set forth in claim 2, wherein said head is electrically insulated from said plunger.

4. A silencer as set forth in claim 3, wherein said local actuator is a latching solenoid operatively coupled to said plunger, and said remote actuator is constituted by a manually-operated switch connected in series with a battery to supply operating pulses to said solenoid through an extension cable linking the actuators.

5. A silencer as set forth in claim 3, wherein said local actuator includes a click type mechanism having a control pin which when first pressed advances said plunger, and when again pressed retracts said plunger.

6. A silencer as set forth in claim 5, wherein said mechanism pin is coupled to a diaphragm enclosing a pneumatic chamber which is coupled by a hollow cable to the remote actuator which takes the form of a squeeze bulb.

7. A silencer as set forth in claim 1, wherein said member is a rotatable shaft having a bent portion which supports said head eccentrically with respect to the axis of rotation whereby when the shaft is rotated by the local actuator, said head goes from its displaced position to a position in engagement with said nose.

8. A silencer as set forth in claim 7, wherein said local actuator is a stepping motor.

* * * * *